(12) United States Patent
Jamal et al.

(10) Patent No.: US 12,062,409 B2
(45) Date of Patent: Aug. 13, 2024

(54) COMPACT MEMORY DEVICE HAVING A BACKUP POWER SOURCE

(71) Applicant: Pliops Ltd., Tel Aviv (IL)

(72) Inventors: Naseem Jamal, Tel Aviv (IL); Tomer Plut, Tel Aviv (IL); Itai Ben Zion, Tel Aviv (IL)

(73) Assignee: PLIOPS LTD., Tel Aviv (IL)

( * ) Notice: Subject to any disclaimer, the term of this patent is extended or adjusted under 35 U.S.C. 154(b) by 626 days.

(21) Appl. No.: 17/180,699

(22) Filed: Feb. 19, 2021

(65) Prior Publication Data

US 2022/0270652 A1    Aug. 25, 2022

(51) Int. Cl.
*G11C 5/14*     (2006.01)
*H05K 1/02*     (2006.01)
*H05K 1/14*     (2006.01)
*H05K 1/18*     (2006.01)

(52) U.S. Cl.
CPC ........... *G11C 5/141* (2013.01); *H05K 1/0206* (2013.01); *H05K 1/144* (2013.01); *H05K 1/181* (2013.01); *H05K 2201/042* (2013.01); *H05K 2201/066* (2013.01); *H05K 2201/10015* (2013.01); *H05K 2201/10159* (2013.01)

(58) Field of Classification Search
CPC ...... G11C 5/141; H05K 1/0206; H05K 1/144; H05K 1/181; H05K 2201/042; H05K 2201/066; H05K 2201/10015; H05K 2201/10159
See application file for complete search history.

(56) References Cited

U.S. PATENT DOCUMENTS

| | | | |
|---|---|---|---|
| 8,339,794 B2* | 12/2012 | Bang | H05K 1/18 361/728 |
| 9,070,443 B2* | 6/2015 | Park | G06F 3/0626 |
| 9,645,902 B2* | 5/2017 | Breakstone | H04L 41/0893 |
| 10,085,364 B2* | 9/2018 | Voss | H05K 7/20436 |
| 10,123,419 B2* | 11/2018 | Pihlman | H05K 1/0296 |

* cited by examiner

*Primary Examiner* — Son L Mai
(74) *Attorney, Agent, or Firm* — Reches Patents

(57) ABSTRACT

A memory device that may include a primary PCB that is configured to support one or more SSD units and one or more volatile memory units; a secondary PCB that is configured to mechanically support multiple supercapacitors; wherein the secondary PCB comprises an aperture and an array of heat different reduction elements configured to reduce temperature differences between different parts of the secondary PCB; a board to board connector for electrically coupling at least one electrical conductor of the primary PCB to at least one electrical conductor of the secondary PCB; a mechanical interface that has a base, a top section and a threaded hole that passes through the base and the top section; wherein the base is wider than the top section; wherein the top section is shaped and sized to enter the aperture of the secondary PCB; wherein the base is configured to support the secondary PCB when the top section enters the aperture. The height of the base, a height of the board to board connector, and a width of the secondary PCB may be smaller than a millimeter.

20 Claims, 9 Drawing Sheets

COMPACT MEMORY DEVICE HAVING A BACKUP POWER SOURCE

BACKGROUND

Memory devices such as Peripheral Component Interconnect express (PCIe) Solid State Drive (SSD) memory devices may include one or more volatile memory units that may require backup power. The backup power may be provided by bulky power sources or batteries.

On the other hand—memory devices such as PCIe SSD memory devices must be compact and should fit legacy server form factors—such as the PCIe HHHL (half height, half length) form factor.

There is a growing need to provide a compact memory devices.

SUMMARY

A compact supercapacitor unit.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
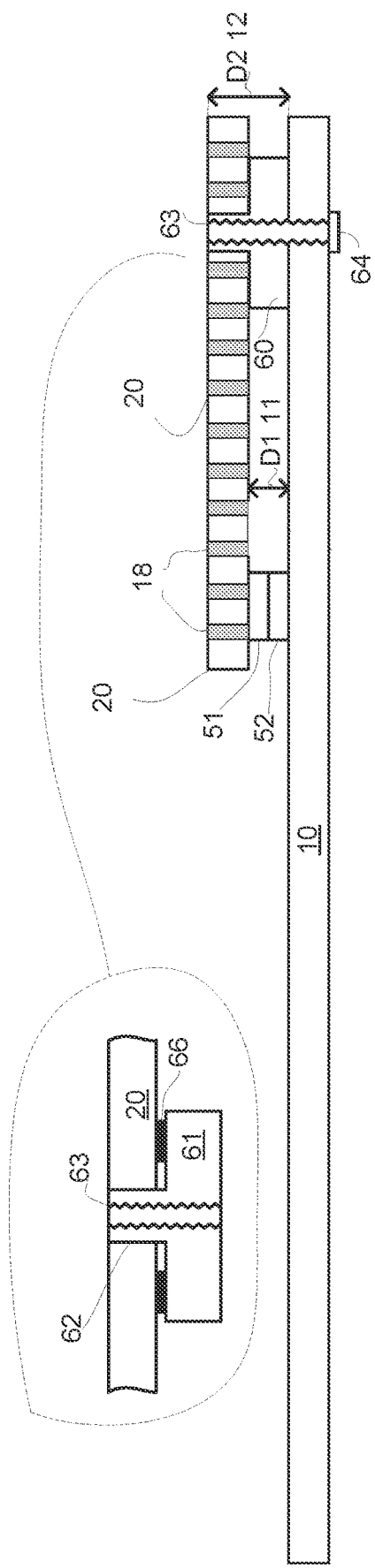
FIG. 1 illustrates an example of one or more parts of a compact memory device.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device capable of executing the method and/or to a device manufactured by the method.

Any reference in the specification to a device should be applied mutatis mutandis to a method that may be executed by the device, and/or may be applied mutatis mutandis to method for manufacturing the device.

Any combination of any module or unit listed in any of the figures, any part of the specification and/or any claims may be provided.

Any combination of any steps of any method illustrated in the specification and/or drawings may be provided.

Any combination of any subject matter of any of claims may be provided.

Any combinations of systems, units, components, illustrated in the specification and/or drawings may be provided.

Any value (width, form factor, distance, number of supercapacitors, temperature, capacitance, diameter, length, power capacity) mentioned in the application may be replaced by another value.

There is provided a memory device that is compact and may, for example have a Peripheral Component Interconnect express (PCIe) half height, half length (HHHL) form factor or any other form factors.

The memory device may include supercapacitors that may be higher than other components (for example one or more SSD units) of the memory device. This may require to support the supercapacitors on a secondary PCB that may be slim—for example of a width of 0.5 millimeter.

The supercapacitors may have a capacitance of up to 195 F, may have a diameter of 10 mm and a length of 40 mm, may include four supercapacitors with two serial two parallel configuration, may provide 25 watts for 16 seconds, may be manufactured by Vinatech.

The narrow width of the secondary PCB may cause the secondary PCB to bend or otherwise be deformed under thermal stress.

In order to reduce the thermal stress the secondary PCB may include heat different reduction elements configured to reduce temperature differences between different parts of the secondary PCB that may be spread over the entire secondary PCB, over at least a majority of the secondary PCB, or over smaller areas (less that a majority) of the secondary PCB. Additionally or alternatively, the PCB can have elements that are managed to cope with high temperatures—for example—the core and/or dielectric layers may be made of high temperature resistant resins (for example having Tg of 180° C., 340° C. decomposition temperature and low CTE)—for example using the 185HR resin system of Isola.

The heat different reduction elements may be thermal relief elements such as holes filled with heat conductive material. A heat conductive material has a heat conductivity that exceeds the heat conductivity of one or more other parts of the secondary PCB—such as a core, a dielectric layer, and the like.

The secondary PCB may include conductors (for example copper conductors) that may electrically couple the supercapacitors to other components of the memory device—for example to one or more volatile memory units, to a power distribution elements that supply power to the one or more volatile memory units, and the like. The conductors may be thin (in order to maintain the thickness of the secondary PCB) but have a significant cross section—in order to reduce the serial resistance between the supercapacitors and a board to board connector that coupled one or more conductors o the primary PCB to one or more conductors of the secondary PCB. An example of a board to board connector is the B01 series board-to-FPC connectors of Panasonic Inc.

The memory device may include a screw that may be configured to hold the primary PCB, the mechanical interface and the secondary PCB together when engaged with a threaded hole of a mechanical interface.

The height of the supercapacitors may also require maintaining a small gap (for example 0.6 millimeter) between the primary PCB and the secondary PCB.

This small gap may not allow the screw to be rotated by a desirable amount (at least one full turn) that will allow the screw to firmly hold the primary PCB and the secondary PCB to each other.

In order to allow the screw to be rotated by at least by the desirable amount—a part (top part) of the mechanical interface extends through an aperture formed in the secondary PCB—so that the depth of the threaded hole exceeds 0.6 millimeters—and may be, for example the sum of the gap plus the width of the secondary PCB—for example have a total depth of 1.1 millimeter.

FIG. 1-7 illustrates example of a memory device (or at least examples of parts of the memory device). The memory device may include:
a. A primary PCB that is configured to support one or more solid state drive (SSD) units and one or more volatile memory units.
b. A secondary PCB that is configured to mechanically support multiple supercapacitors; wherein the secondary PCB comprises an aperture and an array of heat different reduction elements configured to reduce temperature differences between different parts of the secondary PCB.
c. A board to board connector for electrically coupling at least one electrical conductor of the primary PCB to at least one electrical conductor of the secondary PCB.
d. A mechanical interface that has a base, a top section and a threaded hole that passes through the base and the top section; wherein the base is wider than the top section; wherein the top section is shaped and sized to enter the aperture of the secondary PCB; wherein the base is configured to support the secondary PCB when the top section enters the aperture.
e. A height of the base, a height of the board to board connector, and a width of the secondary PCB are smaller than a millimeter.

The heat different reduction elements may be holes that pass through a part of, or the entire second PCB and may be filled with a heat conducting material. The heat different reduction elements may be of any shape and/or size.

The heat different reduction elements may be arranged as an ordered array, an ordered grid or an ordered grid.

The heat different reduction elements span over any part and/or any fraction of the secondary PCB.

The memory device may include a screw that may be configured to hold the primary PCB, the mechanical interface and the secondary PCB together when engaged with the threaded hole.

The memory device may include a screw that may be configured to hold the primary PCB, the mechanical interface and the secondary PCB together when engaged with the threaded hole and after being rotated by at least one full turn.

The height of the base may be 0.6 millimeters, a height of the board to board connector may be 0.6 millimeters, and a width of the secondary PCB may be 0.5 millimeters. Other heights and/or widths may be provided.

The memory device may have a Peripheral Component Interconnect express (PCIe) half height, half length (HHHL) form factor—or any other form factor.

The secondary PCB may be shaped and sized to mechanically support four supercapacitors.

The secondary PCB may be shaped and sized to mechanically support (a) three supercapacitors that may be parallel to each other, and (b) a fourth supercapacitor that may be perpendicular to the three supercapacitors and partially extends outside the secondary PCB.

The secondary PCB may include a core, an upper intermediate copper layer, a lower intermediate copper layer, an upper set of dielectric layers, a lower set of dielectric layers, an upper copper layer and a lower copper layer.

The thickness of each one of the upper intermediate copper layer and the lower intermediate copper layer may be more than twice a thickness of each one of the upper copper layer and the lower copper layer.

The thickness of each one of the upper copper layer and the lower copper layer may be 1 Oz (1.37 Mils).

The thickness of each one of the upper intermediate copper layer and the lower intermediate copper layer may be 2 Oz (2.8 Mils).

The secondary PCB may consist or consist essentially of the aperture, the array of heat different reduction elements, a core, an upper intermediate copper layer, a lower intermediate copper layer, an upper set of dielectric layers, a lower set of dielectric layers, an upper copper layer and a lower copper layer.

The memory device may include the one or more SSD units such as one or more SSD chips, one or more volatile memory units, a memory controller, and the like.

The one or more volatile memory units may be positioned between the secondary PCB and a heat sink.

The memory device may include multiple supercapacitors.

The one or more SSD units may be supported by the primary PCB or by another part of the memory device. The one or more SSD units may be connected to one side of the primary PCB, while the one or more volatile memory units may be supported by an opposite side of the primary PCB—but other locations may be suggested.

FIG. 1 is a cross sectional view taken along a longitudinal axis of the primary PCB 10 and at a center of the primary PCB.

The cross sectional view illustrates:
a. Primary PCB 10.
b. Secondary PCB 20, and heat different reduction elements 18 formed in the secondary PCB.
c. Mechanical interface 60 that has base 61, top section 62 and threaded hole 63.
d. Gluing elements 66 for gluing the base 61 to the secondary PCB 20.

e. Screw 64 that engaged with the threaded hole 63.

f. Board to board connector that has secondary PCB part 51 and primary PCB part 52, each connected to one or more conductors of the secondary PCB and the primary PCB accordingly.

g. Height (D1 11) of the gap between the primary PCB and the secondary PCB.

h. Sum (D2 12) of the height of the gap and width of the secondary PCB, which is the depth of the threaded hole 63.

Figure 2:
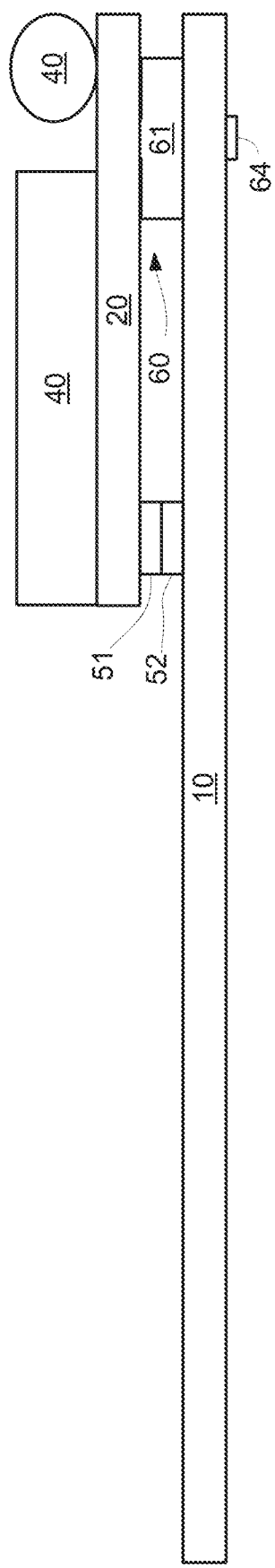
FIG. 2 illustrates an example of one or more parts of a compact memory device.

FIG. 2 is a side view taken along a longitudinal axis of the primary PCB 10 and at a center of the primary PCB. The lower part also illustrates supercapacitors 40 connected to the secondary PCB.

The cross sectional view illustrates:

a. Primary PCB 10.

b. Secondary PCB 20, and heat different reduction elements 18 formed in the secondary PCB.

c. Mechanical interface 60. The side view illustrates Only the base 61 is shown as the top section is within the aperture of the secondary PCB and cannot be seen from the side.

d. Screw 64—but only its top is shown.

e. Board to board connector that has secondary PCB part 51 and primary PCB part 52, each connected to one or more conductors of the secondary PCB and the primary PCB accordingly. The board to board connector coupled the supercapacitors to one or more electrical component located on the primary PCB.

Figure 3:
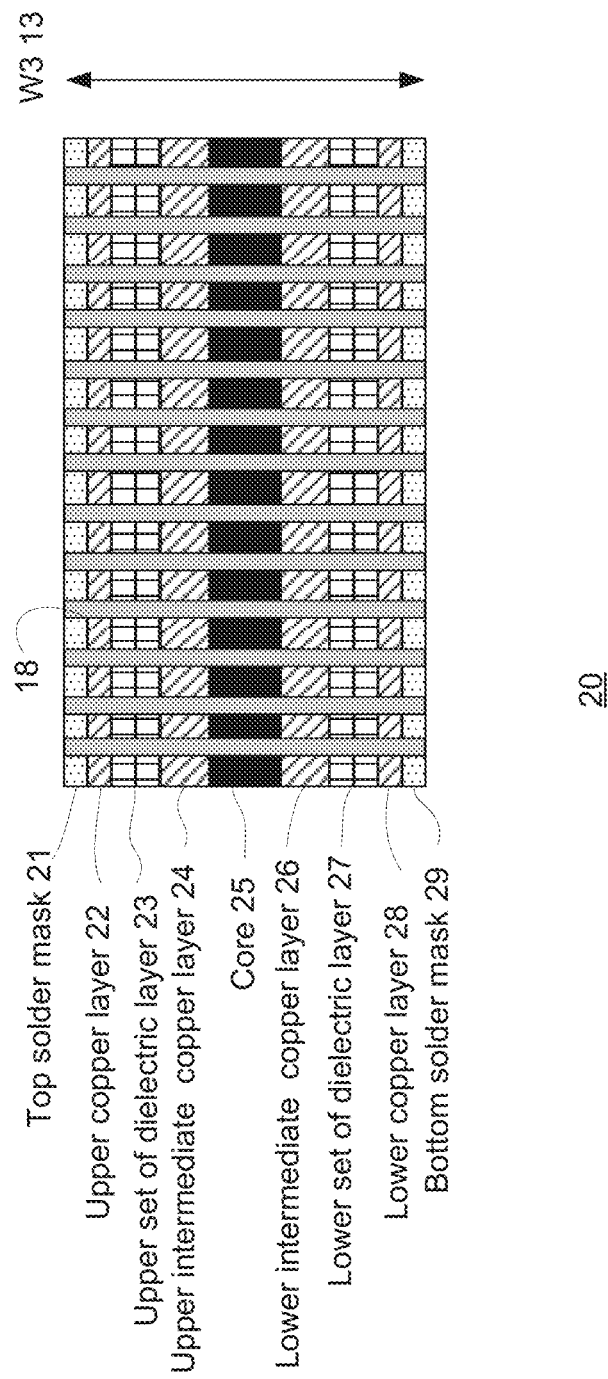
FIG. 3 illustrates an example of one or more parts of a compact memory device.

FIG. 3 illustrates a cross section of secondary PCB 20 (which is out of scale) showing the heat different reduction elements 18 as crossing the following layers (from top to bottom):

a. Top soler mask 21.

b. Upper copper layer 22.

c. Upper set of dielectric layers 23.

d. Upper intermediate copper layer 24.

e. Core 25.

f. Lower intermediate copper layer 26.

g. Lower set of dielectric layers 27.

h. Lower copper layer 28.

i. Bottom solder mask 29.

Figure 4:
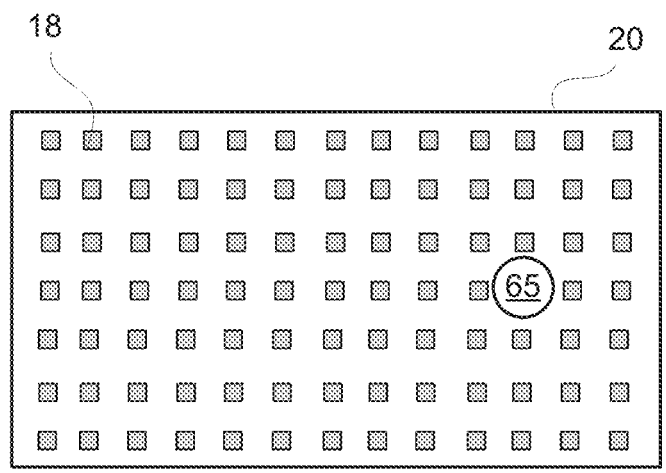
FIG. 4 illustrates an example of one or more parts of a compact memory device.

FIG. 4 is a top view of secondary PCB 20 illustrating an array of heat different reduction elements 18 and aperture 65 (through which the top section of the structural element enters).

Figure 5:
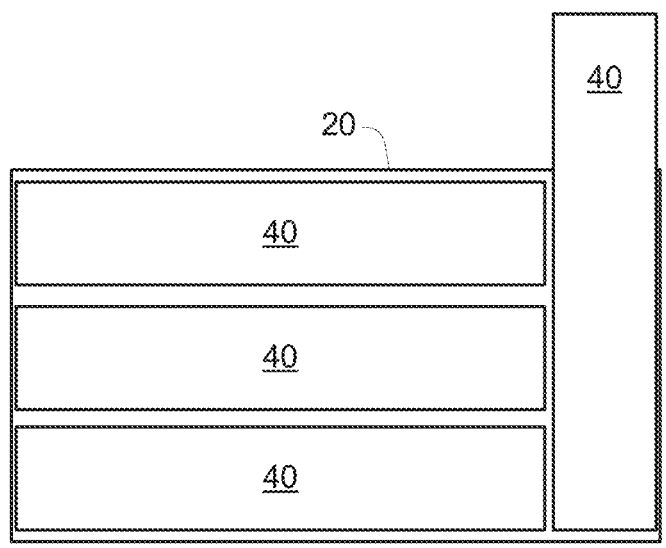
FIG. 5 illustrates an example of one or more parts of a compact memory device.

FIG. 5 is a top view of secondary PCB 20 that mechanically support (a) three supercapacitors that are parallel to each other, and (b) a fourth supercapacitor that is perpendicular to the three supercapacitors and partially extends outside the secondary PCB. This configuration assists in maintaining a compact memory devices.

Figure 6:
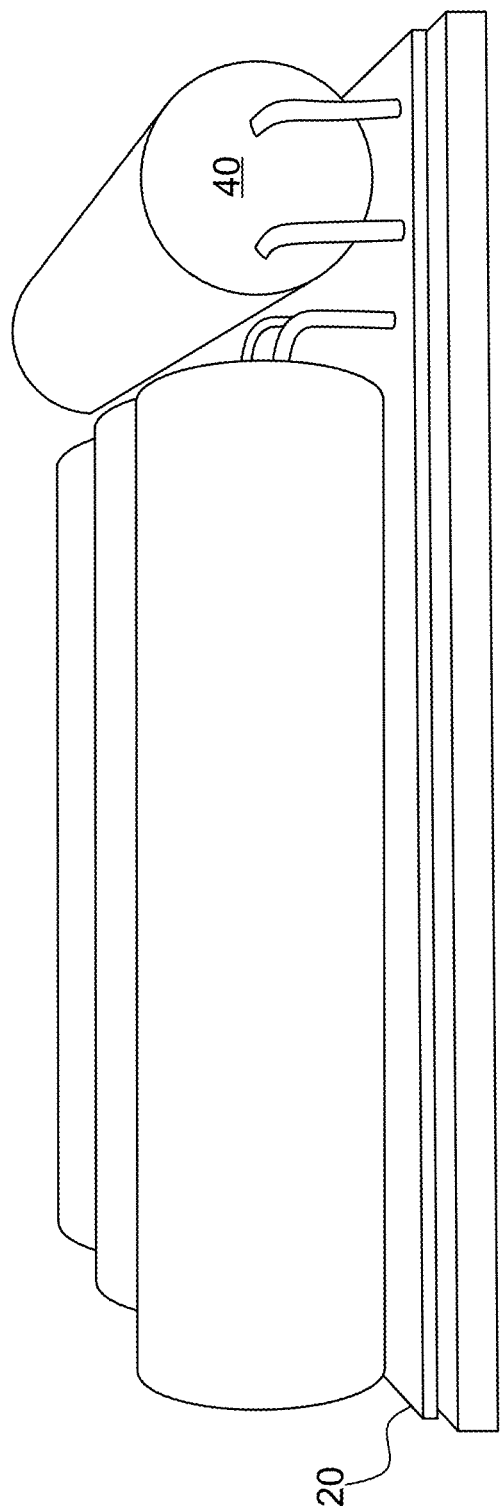
FIG. 6 illustrates an example of one or more parts of a compact memory device.

FIG. 6 is an image of the secondary PCB 20 and the four supercapacitors 40.

Figure 7:
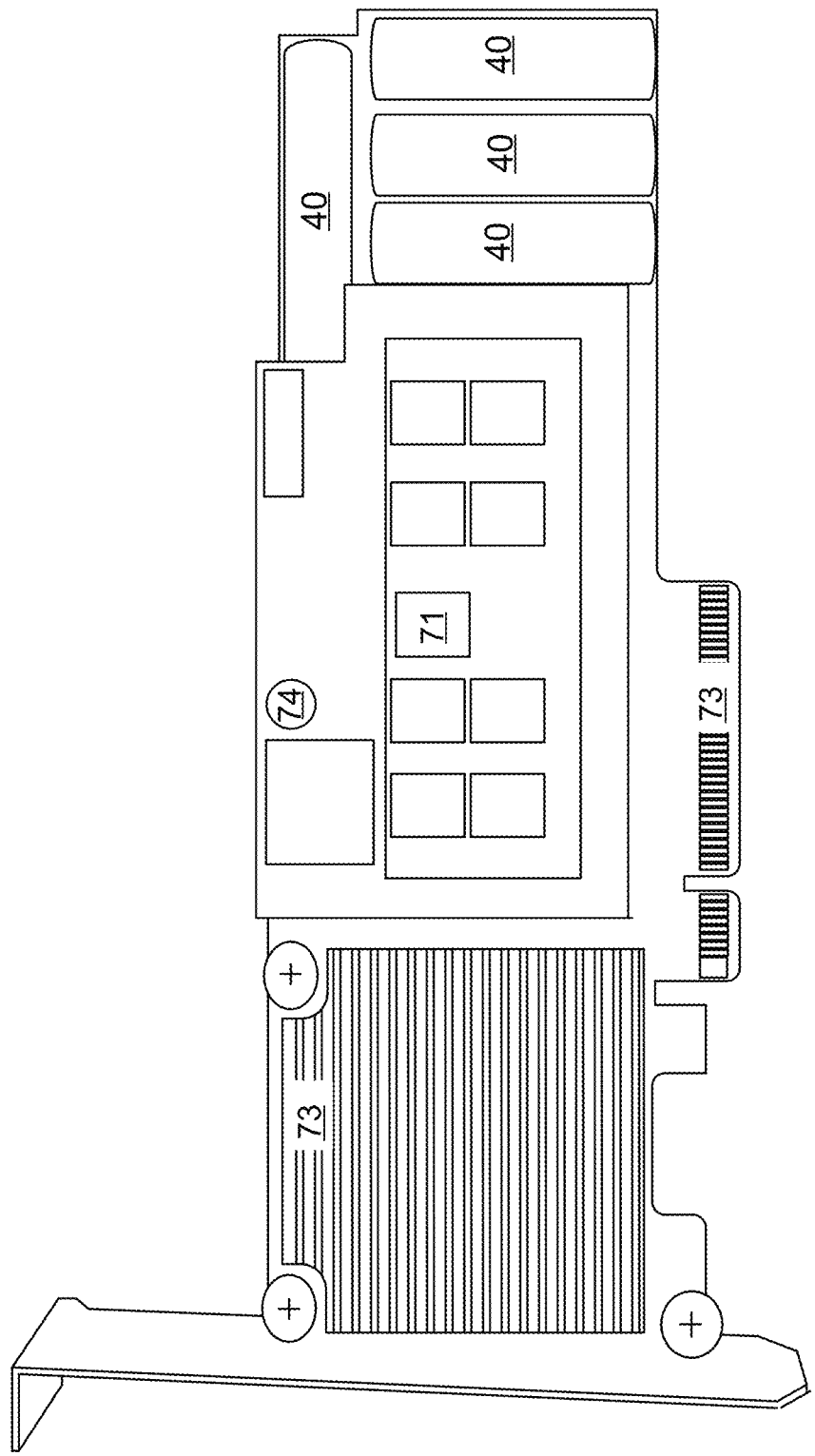
FIG. 7 illustrates an example of one or more parts of a compact memory device.

FIG. 7 illustrates a top view of memory device 10 that illustrates (from right to left):

a. Secondary PCB 20 and the four supercapacitors 40.

b. Memory and logical elements—for example volatile memory units 71 that may require power upon failure of the primary supply—to maintain stored data, battery 74, and primary PCB connector 73.

c. Heat sink 72 for dispersing heat from a chip (for example a FPGA) located below the heat sink.

d. Sidewall 77.

Figure 8:
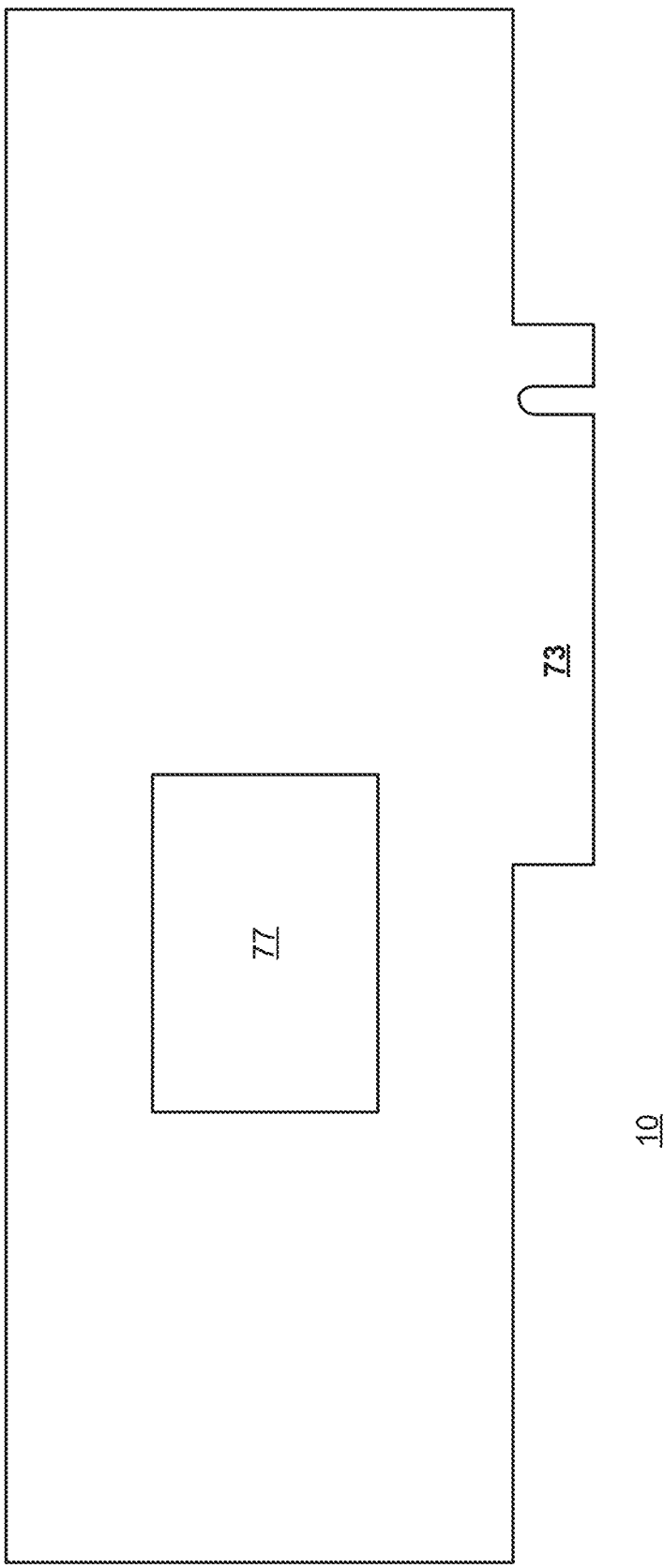
FIG. 8 illustrates an example of one or more parts of a compact memory device.

FIG. 8 illustrates the other side of the memory device 10—and illustrates one or more SSD units (such as SSD memory chips) 77 connected to the opposite side of the primary PCB.

Figure 9:
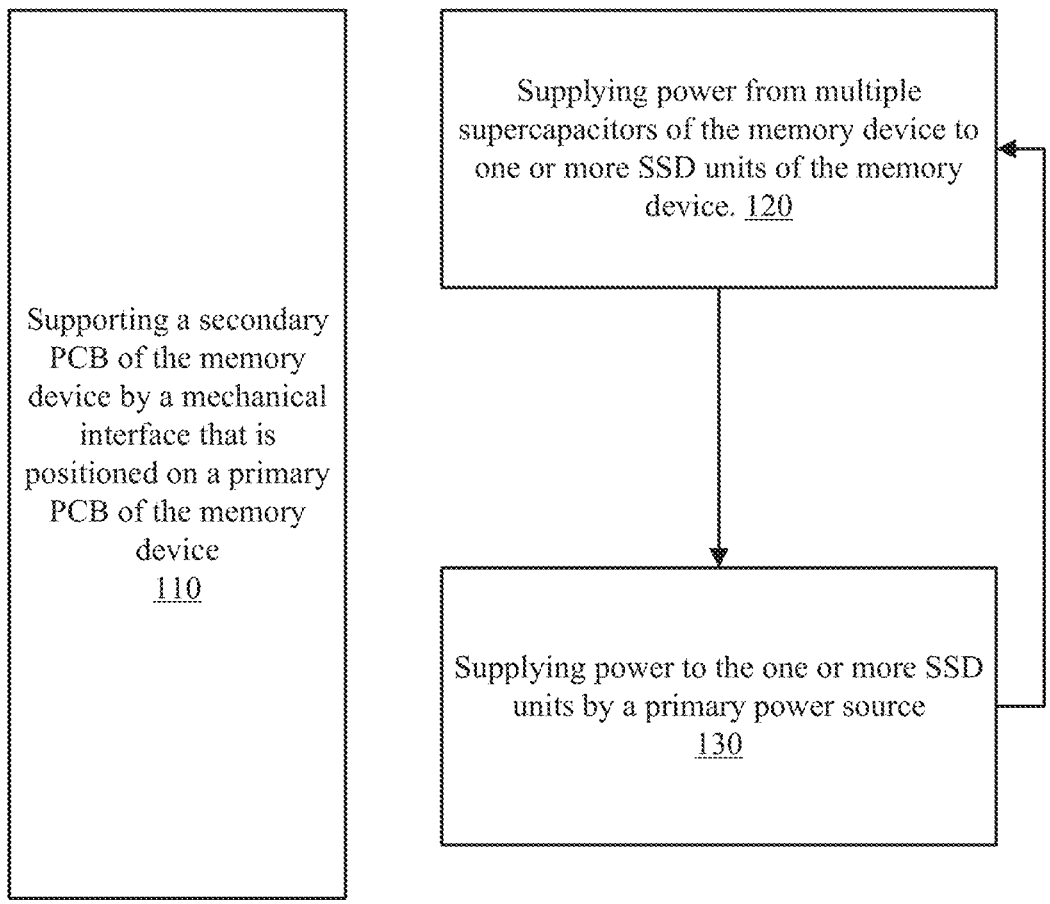
FIG. 9 illustrates an example of a method.

FIG. 9 illustrates method 100.

Method 100 is for operating the memory device of any of the previous figures.

Method 100 may include step 110 of supporting a secondary printed circuit board (PCB) of the memory device by a mechanical interface that is positioned on a primary PCB of the memory device.

The primary PCB is configured to support one or more SSD units on one side and one or more SSB units—for example at another location—such as on the other side of the primary PCB.

The secondary PCB is configured to mechanically support the multiple supercapacitors.

The secondary PCB comprises an aperture and an array of heat different reduction elements configured to reduce temperature differences between different parts of the secondary PCB.

The memory device further comprises a board to board connector for electrically coupling at least one electrical conductor of the primary PCB to at least one electrical conductor of the secondary PCB.

The mechanical interface that has a base, a top section and a threaded hole that passes through the base and the top section; wherein the base is wider than the top section. The top section is shaped and sized to enter the aperture of the secondary PCB.

Method 100 may also include step 120 of supplying power from multiple supercapacitors of the memory device to one or more volatile memory units of the memory device.

The supercapacitors may be sued as secondary source and/or as backup source and step 120 may be executed when the primary power source fails, or for any other reason. Thus step 120 may be triggered when a failure happens.

Method 100 may include step 130 of supplying power to the one or more volatile memory units by a primary power source. Step 130 may also include charging the supercapacitors.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Any reference to "consisting", "having" and/or "including" should be applied mutatis mutandis to "consisting" and/or "consisting essentially of".

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

We claim:

1. A memory device, comprising:
   a primary printed circuit board (PCB) that is configured to support one or more solid state drive (SSD) units and one or more volatile memory units;
   a secondary PCB that is configured to mechanically support multiple supercapacitors; wherein the secondary PCB comprises an aperture and an array of heat different reduction elements configured to reduce temperature differences between different parts of the secondary PCB;
   a board to board connector for electrically coupling at least one electrical conductor of the primary PCB to at least one electrical conductor of the secondary PCB; and
   a mechanical interface that has a base, a top section and a threaded hole that passes through the base and the top section; wherein the base is wider than the top section; wherein the top section is shaped and sized to enter the aperture of the secondary PCB; wherein the base is configured to support the secondary PCB when the top section enters the aperture.

2. The memory device according to claim 1 wherein a height of the base, a height of the board to board connector, and a width of the secondary PCB are smaller than a millimeter.

3. The memory device according to claim 1 wherein the heat different reduction elements are holes that pass through the second PCB and are filled with a heat conducting material.

4. The memory device according to claim 1 wherein the heat different reduction elements are form an ordered grid of heat different reduction elements.

5. The memory device according to claim 1 wherein the heat different reduction elements span over a majority of the secondary PCB.

6. The memory device according to claim 1 comprising a screw that is configured to hold the primary PCB, the mechanical interface and the secondary PCB together when engaged with the threaded hole.

7. The memory device according to claim 1 comprising a screw that is configured to hold the primary PCB, the mechanical interface and the secondary PCB together when engaged with the threaded hole and after being rotated by at least one full turn.

8. The memory device according to claim 1 wherein a height of the base is 0.6 millimeters, a height of the board to board connector is 0.6 millimeters, and a width of the secondary PCB is 0.5 millimeters.

9. The memory device according to claim 1 having a Peripheral Component Interconnect express (PCIe) half height, half length (HEEL) form factor.

10. The memory device according to claim 1 wherein the secondary PCB is shaped and sized to mechanically support four supercapacitors.

11. The memory device according to claim 1 wherein the secondary PCB is shaped and sized to mechanically support (a) three supercapacitors that are parallel to each other, and (b) a fourth supercapacitor that is perpendicular to the three supercapacitors and partially extends outside the secondary PCB.

12. The memory device according to claim 1 wherein the secondary PCB comprises, a core, an upper intermediate copper layer, a lower intermediate copper layer, an upper set of dielectric layers, a lower set of dielectric layers, an upper copper layer and a lower copper layer.

13. The memory device according to claim 12 wherein a thickness of each one of the upper intermediate copper layer and the lower intermediate copper layer is more than twice a thickness of each one of the upper copper layer and the lower copper layer.

14. The memory device according to claim 12 wherein the thickness of each one of the upper copper layer and the lower copper layer is 3.5 Mil.

15. The memory device according to claim 1 wherein the secondary PCB consists essentially of the aperture, the array of heat different reduction elements, a core, an upper intermediate copper layer, a lower intermediate copper layer, an upper set of dielectric layers, a lower set of dielectric layers, an upper copper layer and a lower copper layer.

16. The memory device according to claim 15 wherein a height of the base is 0.6 millimeters, a height of the board to board connector is 0.6 millimeters, and a width of the secondary PCB is 0.5 millimeters.

17. The memory device according to claim 1 comprising the one or more volatile memory units.

18. The memory device according to claim 16 wherein the one or more volatile memory units are positioned between the secondary PCB and a heat sink.

19. The memory device according to claim 1 comprising the multiple supercapacitors.

20. A method for operating a memory device, the method comprising:
  supporting a secondary printed circuit board (PCB) of the memory device by a mechanical interface that is positioned on a primary PCB of the memory device; and
  supplying power from multiple supercapacitors of the memory device to one or more volatile memory units of the memory device;
  wherein the primary PCB is configured to support one or more SSD units and the one or more volatile memory units; wherein the secondary PCB is configured to mechanically support the multiple supercapacitors; wherein the secondary PCB comprises an aperture and an array of heat different reduction elements configured to reduce temperature differences between different parts of the secondary PCB; wherein the memory device further comprises a board to board connector for electrically coupling at least one electrical conductor of the primary PCB to at least one electrical conductor of the secondary PCB;
  wherein the mechanical interface that has a base, a top section and a threaded hole that passes through the base and the top section; wherein the base is wider than the top section; wherein the top section is shaped and sized to enter the aperture of the secondary PCB.

* * * * *